United States Patent [19]

Park et al.

[11] Patent Number: 5,305,279

[45] Date of Patent: Apr. 19, 1994

[54] SEMICONDUCTOR MEMORY DEVICE HAVING WORD LINE SELECTION LOGIC CIRCUITS

[75] Inventors: Hee-Choul Park; Seong-Jin Han; Byeong-Yun Kim, all of Seoul, Rep. of Korea

[73] Assignee: Samsung Electronics Co., Ltd., Rep. of Korea

[21] Appl. No.: 855,556

[22] Filed: Mar. 23, 1992

[30] Foreign Application Priority Data

Aug. 27, 1991 [KR] Rep. of Korea ............... P 91-14873

[51] Int. Cl.⁵ .................................................. G11C 8/00
[52] U.S. Cl. ............................ 365/230.03; 365/230.06
[58] Field of Search ...................... 365/230.03, 230.06

[56] References Cited

U.S. PATENT DOCUMENTS

| Re. 33,280 | 7/1990 | Yoshimoto et al. | 365/230.03 |
| 4,723,229 | 2/1988 | Hartgring et al. | 365/230.03 |
| 4,972,373 | 11/1990 | Kim et al. | 365/230.03 |
| 4,977,538 | 12/1990 | Anami et al. | 365/230.03 |
| 5,034,928 | 7/1991 | Isobe | 365/230.03 |

FOREIGN PATENT DOCUMENTS 2159359A 11/1985 United Kingdom .

Primary Examiner—Eugene R. LaRoche
Assistant Examiner—Andrew Tran
Attorney, Agent, or Firm—Clifford A. Poff

[57] ABSTRACT

The invention relates to word line selection logic circuits for a semiconductor memory device composed of a plurality of memory blocks. Word line selection logic circuits are composed of groups of word line blocks, and semiconductors for switches operated by an output signal from a block selection decoder to activate a selected word line block. The switches are assigned to each block, and one of the word lines within the memory blocks is selected by supplying the activated word line block with an output signal from a row decoder which ensures improvement in access time and high density.

6 Claims, 2 Drawing Sheets

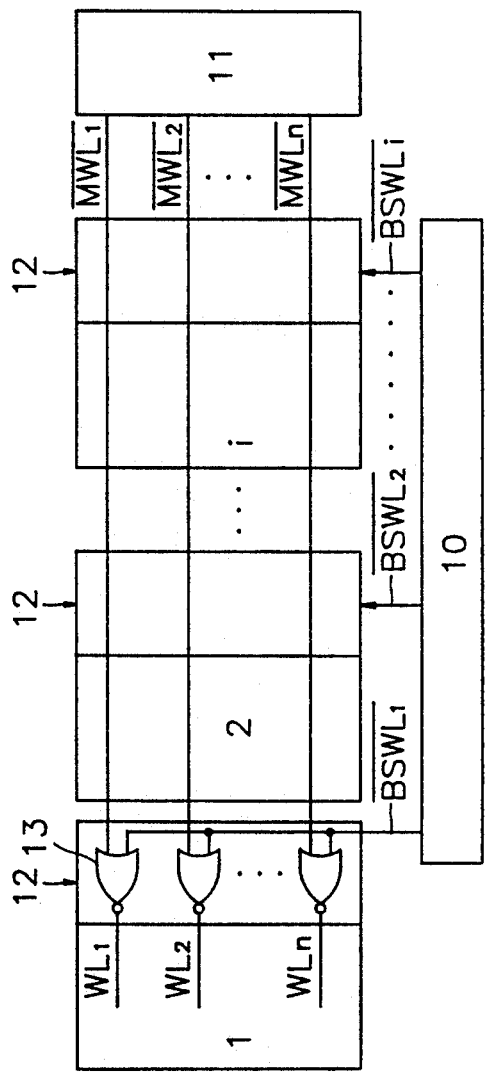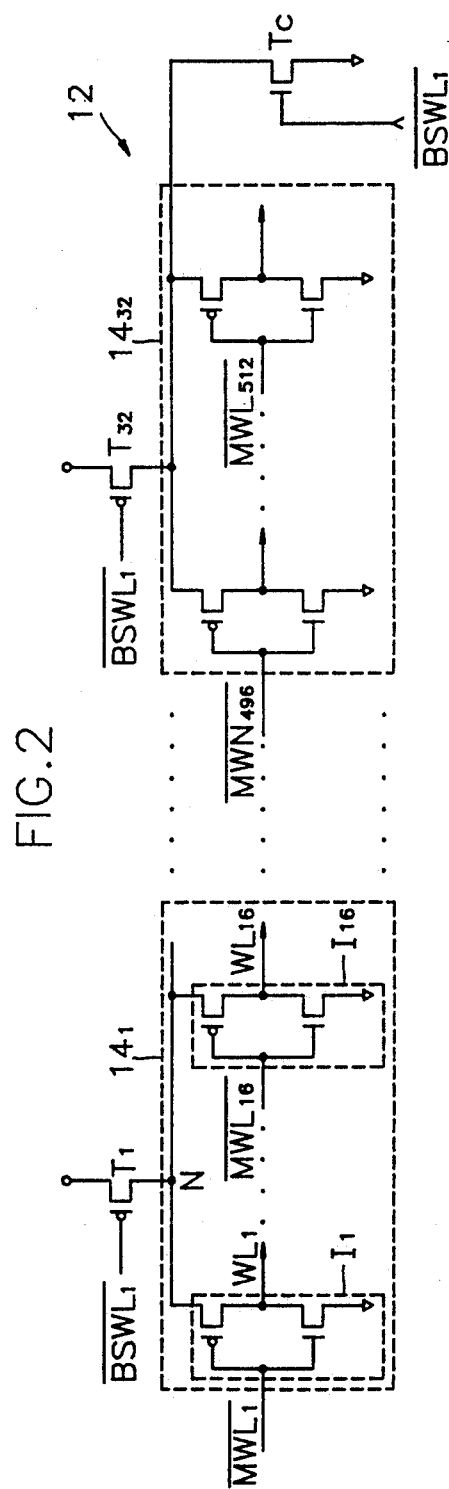
FIG.1 (Prior Art)
FIG.2

SEMICONDUCTOR MEMORY DEVICE HAVING WORD LINE SELECTION LOGIC CIRCUITS

BACKGROUND OF THE INVENTION

1. Field of the Invention

The present invention relates to an integrated semiconductor memory device divided into a plurality of memory blocks, and more particularly, to a semiconductor device including memory blocks that have in a matrix array of plurality of memory cells and a decoding means suitable for the selection of memory cells.

2. Description of the Prior Art

Well known circuits for semiconductor memory devices are disclosed in pages 264–265 of the ISSCC Journal, published on 1987. This art of semiconductor technology forms the basis for the technological improvement represented by the present invention.

It is known in the art, as illustrated by a schematic block diagram of FIG. 1, to divide an integrated semiconductor memory device into a plurality of memory blocks to allow effective access to one memory cell in a high capacity memory. Such as arrangement reduces the delay required to access from main word line to block word line because memory cells are divided into a plurality of memory blocks. A certain memory cell is selected when a memory block selected among the divided plurality of memory blocks which ensures an improvement to the access time and power consumption by the memory device.

In the prior art form of a memory shown in FIG. 1, reference numerals 1, 2 . . . i each identify a memory block and each such block includes an array of memory cells arranged in the form of matrix. Each memory block is selected by a block selection signal $BSWL_1$, $BSWL_2$, . . . or $BSWL_i$ outputted from block selection decoder 10 in response to an input signal. A word line $WL_1$, $WL_2$ or $WL_n$ in memory blocks is selected by row selection signal $MWL_1$, $MWL_2$ . . . $MWL_n$ outputted from row decoder 11 in response to a row address input signal. In a high capacity memory circuit, when a memory cell array is divided into a plurality of memory blocks, word line selection logic circuits 12 are required and take the form of NOR logic or NAND logic circuits for decoding the divided blocks. NOR logic circuits 13 are illustrated in FIG. 1.

Such a logic circuit includes a plurality of transistors, and, more particularly, a NOR or NAND logic circuit requires four to six transistors to form the logic of the circuit. Therefore, when high capacity memory cells are fabricated, the chip area required to form the required logic circuits for selective access to the memory cells is increased and the speed at which the logic circuits operate is slower as compared with, for example, an inversion logic circuit. Moreover, the input gate capacitance of the logic circuits connected to each word line $WL_1$, $WL_2$ . . . $WL_n$ within the memory blocks cause the problem of deterioration to the high speed performance.

SUMMARY OF THE INVENTION

An object of the present invention is to provide a semiconductor memory device including word line selection logic circuits of improved and simplified construction to ensure high speed performance and decrease to the chip area required to construct logic circuits for accessing the memory device.

A main feature of the present invention is that a word line is segmented into a plurality of block units and as a block unit is selected, a word line of the selected block unit can be selected. Word line selection logic circuits are divided into a plurality of groups of word lines blocks, and each block has switching means switched by an output signal from a block selection decoder to activate a selected word line block. An output signal from a row decoder is supplied to the activated word line block and one of the word lines in the memory blocks is selected.

Logic means connected to each of the switching means and word lines are selectively associated according to output signals from logic circuits such as inverters, a NOR or a NAND circuits. Thus, the number of active components necessary for forming the logic circuits is reduced which ensures improvement in access time and decrease to the required chip area.

According to the present invention, there is provided a semiconductor memory device having memory blocks made up of a plurality of memory cells arranged in a matrix, a row decoder outputting a selection signal for selecting word lines within the memory blocks, and a memory block selection decoder for selecting each of a plurality of memory blocks, each memory block including word line selection logic circuits for selecting word lines in the memory block in response to an output signal from the row decoder and the memory block selection decoder, the rod line selection logic circuits dividing word lines into blocks and thereby forming a plurality of word line blocks, each having inverters for inverting an output signal from the row decoder to supply the corresponding inverted signal to each word line, the word line blocks further including switching means for selecting a memory block in response to an output signal from the memory block selection decoder for control activation of the inverters.

It is a further object of the present invention to provide a semiconductor memory device having memory blocks made up of a plurality of memory cells arranged in a matrix, a row decoder outputting a selection signal for selecting word lines within the memory blocks, and a memory blocks selection decoder for selecting each of a plurality of memory blocks, each memory block including word line selection logic circuits for selecting word lines in the memory block in response to an output signal from the row decoder and the memory block selection decoder, the word line selection logic circuits dividing word lines into blocks and thereby form a plurality of word lines, each word line block including: a NOR logic circuit including transistors for receiving an output signal from the memory block selection decoder; and inverters connected to each word line in parallel for inverting the output signal from the row decoder thereby forming NOR logic circuit.

It is a still further object of the present invention to provide a semiconductor memory device made up of memory blocks having a plurality of memory cells arranged in a matrix, a row decoder outputting a selection signal for selecting word lines within the memory blocks, and a memory block selection decoder for selecting each of a plurality of memory blocks, each memory block including word line selection logic circuits for selecting word lines in the memory block in response to an output signal from the row decoder and the memory block selection decoder, the word line selection logic circuits dividing word lines into blocks and thereby form a plurality of word lines, each word line block including: MOS switching transistors in responsive to an output signal from the block selection decoder; and inverters coupled to the MOS switching transistors and responsive to the row decoder output signals to select word lines while supplied with power by turning ON the MOS switching transistors.

BRIEF DESCRIPTION OF THE DRAWINGS

These features and advantages of the present invention as well as others will be more fully understood when the following description is read in light of the accompanying drawings in which:

FIG. 1 is a schematic block diagram of a conventional semiconductor memory device;

FIG. 2 is a circuit diagram of a word line selection logic circuit for a semiconductor memory device according to a first embodiment of the present invention.

DETAILED DESCRIPTIONS OF THE PREFERRED EMBODIMENTS

Figure 3:
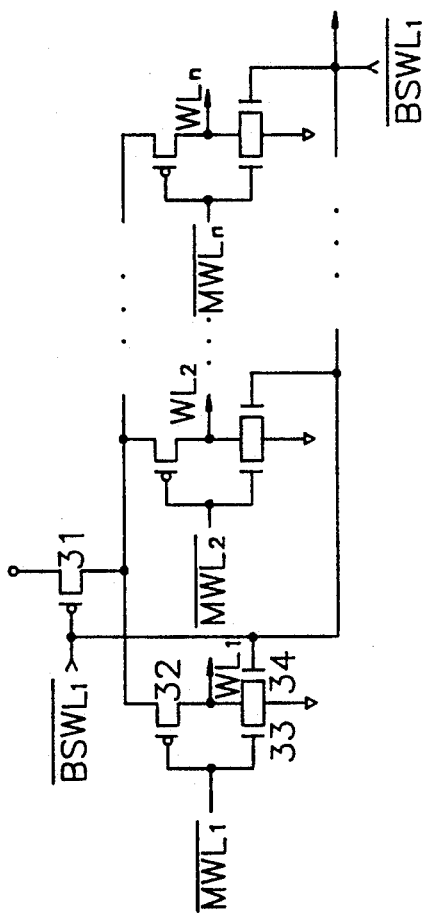
FIG. 3 is a circuit diagram of a word line selection logic circuit for a semiconductor memory device according to a second embodiment of the present invention.

According to a first and preferred embodiment, as shown in FIGS. 2 and 3, there is provided a logic circuit for selection of one of a plurality of word lines in memory block units which are part of a semiconductor memory device according to the present invention. Outputs of inverters which invert an output signal from a row decoder are connected to word lines of a memory block unit switching means, or inverter means allow selection of each word line by providing that the inverted signal of a block selection signal is outputted as a controlling signal in order to control the group of inverters.

FIG. 2 illustrates the details of preferred embodiment of a word line selection logic circuit according to the present invention. This circuit is an improvement over the word line selection logic circuits 12 forming part of the semiconductor memory device described as part of the prior art hereinbefore and shown in FIG. 1.

Thus, it is to be understood that the present invention provides a semiconductor memory device with a word line selection logic circuit comprised of block units, and FIG. 2 illustrates a schematic diagram of a first block identified by reference numeral $14_1$. All such blocks are constructed in a manner identical with one another. In the operation of the circuit of FIG. 2, let it be assumed that the number of the word lines is 512 and a 16th inverter $I_{16}$ within the first word line selection circuit block $14_1$ is selected. In other word, an output signal $MWL_{16}$ is received from the row decoder 11, and at the same time, an output signal $BSWL_1$ is received from the block selection decoder 10 in order to select a memory cell in the memory block 1. Switching means for the whole block comprise transistors $T_1$ and $T_C$. Word line selection signal $MWL_1, MWL_2 \ldots MWL_{16}$ are outputted from the row decoder 11 and are applied to inversion means $I_1, I_2 \ldots I_{16}$, respectively. Each inversion means includes two transistors as shown. The inversion means $I_1, I_2 \ldots I_{16}$ are divided and arranged to form a block unit for 16 word lines. Thus it can be seen that a first block unit among divided block units is thus designated by reference numeral $14_1$. An output signal $BSWL_1$ from the block selection decoder 10 is supplied to transistors $T_1$ and $T_C$ forming an inversion means, i.e., inverter, and therefore, a reversely-inverted signal is formed by applying output signal $BSWL_1$ to an inverter formed by transistors $T_1$ and $T_C$ for selection of word lines. Power is selectively applied into the word line block including the inversion means by output signal $BSWL_1$ from the block selection decoder 10 for invertor selection and operation.

As shown in FIG. 3, a PMOS transistor $T_1$ is arranged in each of 16 word lines and connected to power and a NMOS transistor $T_C$ is connected to ground, as shown, and operates in a powered relation with a PMOS transistor to form a CMOS inverter, i.e., a switching means. Based on the above assumptions, when the inputted signal $BSWL_1$ changes to the low level, the drain voltage of PMOS transistor $T_1$ is supplied as power to the first word line selection circuit block $14_1$, and the inverter $I_{16}$ receiving the signal $MWL_{16}$ thereby supplied with power, is activated. As an output signal, the selection signal is supplied to the word line $WL_{16}$, and a memory cell within the memory block.

According to the above, the number of word lines is 512 and the word lines are divided into 16 word line units so that 32 word line blocks are formed. Each word line block includes 16 CMOS inverters. The PMOS transistor $T_1$ connected to power is assigned to each word line block, and 32 transistors are needed. However, only one NMOS transistor $T_C$ is necessary to operate as a pair with PMOS transistor assigned to each word line block. Therefore, as the number of word lines increases, the smaller the number of elements used in a high density memory device and thereby chip area is advantageously utilized.

According to a specific circuit according to the preferred embodiment of FIG. 2, wherein one of the memory blocks is selected, and as the signal $BSWL_1$ is applied from the block selection decoder at low level, i.e., 0V, the PMOS transistor $T_1$ is ON, and the NMOS transistor $T_C$ is turned OFF. Accordingly, the voltage at node N is 5 V, being changed from low voltage to high voltage. The voltage at node N is supplied as power to the CMOS inverter $I_{16}$ which receives a low signal $MWL_{16}$, and the inverter $I_{16}$ outputs a high level signal which reduces the required access time for the selection of a memory cell.

In terms of physical perimeters when using a MOS transistor if the width/length of gate is 1 um/1 um, the gate capacitance is 1.4 fF. Given that the physical size of PMOS/NMOS type transistor is 20.5 * 1 without any measure, in FIG. 1, the delay of signal by NOR logic circuit is caused by the size of the capacitor, i.e., 20.5 * 20.5 * 512 * 1.4 fF. In comparison with capacitance of transistors forming a NOR gate by 512 word lines, the capacitance of transistors of the present invention depends on only the 32 transistors receiving a signal $BSWL_1$, which ensures a high speed access time. In addition, simple inverters are used in the present invention as compared with NOR or NAND logic circuits comprised of a plurality of active elements forward time selection whereby a high speed performance can be obtained according to the present invention.

Thus, in view of the foregoing, one skilled in this art now understands that the present invention can be applied to a semiconductor device having a high density and to operate with a high speed performance.

FIG. 3 illustrates an embodiment of the present invention wherein a NOR logic circuit is formed and a method of selection of memory cells by NOR logic. A PMOS transistor 31 connected to power among the transistors forming the NOR logic circuit is assigned to each word line block. Transistor 31 of the block units receives the output signals BSWL$_1$, BSWL$_2$ ... BSWL$_i$. The transistors 32, 33 and 34 are arranged as shown for each word line and receive an output signal MWL$_1$, MWL$_2$ ... MWL$_i$ from the row decoder. Transistor 31 assigned to each word line block unit with transistor 32, 33, and 34 for each word line form a NOR logic circuit.

Figure 4:
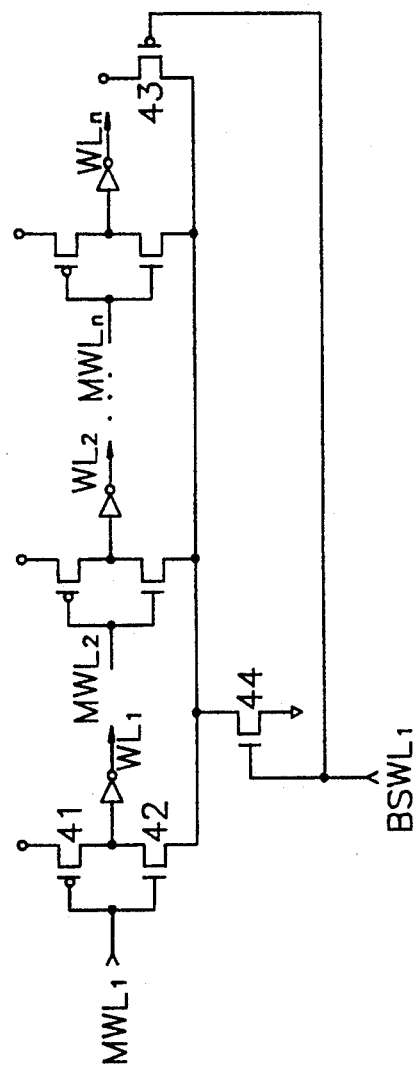
FIG. 4 is a circuit diagram of a word line selection logic circuit using NAND logic circuits for a semiconductor memory device according to a third embodiment of the present invention.

FIG. 4 illustrates an embodiment of the present invention wherein a NAND logic circuit is formed. The combination of transistors 41, 42, 43 and 44 forms a NAND logic circuit, and memory circuit of the present invention is recomposed of a block units. That is, transistors 43 and 44 receiving an output signal BSWL$_1$ from the block selection decoder 10 form a configuration of CMOS inverter. For each word line there are transistors 41 and 42 connected as shown and these word line transistors are arranged in a parallel arrangement to form the configuration of CMOS inverters, that are coupled selectively with the transistors 43 and 44 to form a NAND logic circuit.

The present invention provides a decoding circuit that can be applied suitably to a semiconductor memory device having a high density and high speed performance, and further provides a method of access to memory cells which is advantageous to power consumption.

While the present invention has been described in connection with the preferred embodiments of the various figures, it is to be understood that other similar embodiments may be used or modifications and additions may be made to the described embodiment for performing the same function of the present invention without deviating therefrom. Therefore, the present invention should not be limited to any single embodiment, but rather construed in breadth and scope in accordance with the recitation of the appended claims.

What is claimed is:

1. A semiconductor memory device having memory blocks made up of a plurality of memory cells arranged in a matrix, a row decoder outputting a selection signal for selecting word lines within the memory blocks, and a memory block selection decoder for selecting each of a plurality of memory blocks, each memory block including word line selection logic circuits for selecting word lines in the memory in response to an output signal from said row decoder and said memory block selection decoder, said word line selection logic circuits dividing word lines into blocks and thereby form a plurality of word line blocks each having inverters for inverting an output signal from said row decoder to supply the corresponding inverted signal to each word line, said word line blocks further including switching means for selecting a memory block in response to an output signal from said memory block selection decoder for controlling activation of said inverters, said switching means includes PMOS and NMOS type transistors, one type of said PMOS and NMOS type transistors being connected to a plurality of word line blocks and supplied with a power source for response to an output signal from the block selection decoder, and a second type of said PMOS and NMOS type transistors being connected between said first type and ground whereby only the NMOS and PMOS transistor with a common interconnection turns ON and OFF in response to an output signal from said block selection decoder.

2. A semiconductor memory device as recited in claim 1 wherein said inverters of the word line selection logic circuits include PMOS and NMOS transistors operating to form an inversion means.

3. A semiconductor memory device having memory blocks made up of a plurality of memory cells arranged in a matrix, a row decoder outputting a selection signal for selecting word lines within the memory blocks, and a memory block selection decoder for selecting each of a plurality of memory blocks, each memory block including word line selection logic circuits for selecting word lines in the memory block in response to an output signal from said row decoder and said memory block selection decoder, said word line selection logic circuits dividing word lines into blocks and thereby form a plurality of word line blocks, each word line block including a NOR logic circuit including transistors for receiving an output signal from said memory block selection decoder; and inverters connected to each word line in parallel for inverting the output signal from the row decoder thereby forming NOR logic circuits.

4. A semiconductor memory device having memory blocks made up of a plurality of memory cells arranged in a matrix, a row decoder outputting a selection signal for selecting word lines within the memory blocks, and a memory block selection decoder for selecting each of a plurality of memory blocks, each memory block including word line selection logic circuits for selecting word lines in the memory block in response to an output signal from said row decoder and said memory block selection decoder, said word line selection logic circuits dividing word lines into blocks and thereby form a plurality of word line blocks, each word line block including MOS switching transistors responsive to an output signal from said block selection decoder; and inverters coupled to said MOS switching transistors and responsive to said row decoder output signals to select word lines while supplied with a power source by turning ON said MOS switching transistors.

5. The semiconductor memory device according to claim 4 wherein said MOS switching transistors and said inverters form NAND logic circuits.

6. A semiconductor memory device comprising a switching means including PMOS and NMOS type transistors, one type of said PMOS and NMOS type transistors being connected to a plurality of word line blocks and supplied with a power source for response to an output signal from a block selection decoder, and a second type of said PMOS and NMOS type transistors being connected between the first type and ground whereby only the NMOS and PMOS transistor with a common interconnection turn ON and OFF in response to an output signal from said block selection decoder.

* * * * *